US010361806B2

(12) United States Patent
Nicas et al.

(10) Patent No.: US 10,361,806 B2
(45) Date of Patent: *Jul. 23, 2019

(54) SYSTEM AND METHOD FOR PROVIDING SINGLE FIBER 4K VIDEO

(71) Applicant: AT&T Intellectual Property I, L.P., Atlanta, GA (US)

(72) Inventors: Nicholas Nicas, Blue Springs, MO (US); Todd Andrew Fryer, Liberty, MO (US); David Irvin, Lawrence, KS (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/159,006

(22) Filed: Oct. 12, 2018

(65) Prior Publication Data

US 2019/0052389 A1 Feb. 14, 2019

Related U.S. Application Data

(63) Continuation of application No. 15/615,303, filed on Jun. 6, 2017, now Pat. No. 10,148,381.

(51) Int. Cl.
*H04N 13/25* (2018.01)
*H04J 14/02* (2006.01)
(Continued)

(52) U.S. Cl.
CPC ............ *H04J 14/02* (2013.01); *H03M 1/007* (2013.01); *H03M 1/1205* (2013.01); *H04N 13/239* (2018.05); *H04N 13/25* (2018.05)

(58) Field of Classification Search
None
See application file for complete search history.

(56) References Cited

U.S. PATENT DOCUMENTS 7,548,675 B2  6/2009  Tatum et al.
7,653,924 B1  1/2010  Deng et al.
(Continued)

FOREIGN PATENT DOCUMENTS

CN    104427299 A   3/2015
EP      1667465 A1   6/2006
(Continued)

OTHER PUBLICATIONS

BAE "Assessments of Subjective Video Quality on HEVC-Encoded 4K-UHD Video for Beyond-HDTV Broadcasting Services" (Year: 2013).*

(Continued)

*Primary Examiner* — Eileen M Adams
(74) *Attorney, Agent, or Firm* — Guntin & Gust, PLC; Jay H. Anderson

(57) ABSTRACT

Aspects of the subject disclosure may include, for example, a device that encodes digital signals representing image data captured by a video camera and provided according to a 4K ultra-high definition (4K-UHD) standard. The digital signals are transmitted as serial digital interface (SDI) streams to a wavelength-division multiplexing (WDM) unit; the WDM unit performs electrical-to-optical conversion of the SDI streams and outputs a multiplexed signal to a single fiber-optic cable. The video camera, encoding unit, and WDM unit form a combined module within a housing; the device connects to a proximal end of a single fiber-optic cable, and a distal end of the single fiber-optic cable is configurable for connection to a demultiplexer of a 4K-UHD video presentation device. The multiplexed signal is transmitted on the single fiber-optic cable unidirectionally from the proximal end to the distal end. Other embodiments are disclosed.

20 Claims, 8 Drawing Sheets

(51) Int. Cl.
  *H03M 1/12* (2006.01)
  *H04N 13/239* (2018.01)
  *H03M 1/00* (2006.01)

(56) References Cited

U.S. PATENT DOCUMENTS

| | | | |
|---|---|---|---|
| 8,421,915 | B2 | 4/2013 | Yamashita |
| 8,532,503 | B2 | 9/2013 | Nakashima et al. |
| 8,982,959 | B2 | 3/2015 | Yamashita |
| 9,215,508 | B2 | 12/2015 | Hashiguchi |
| 9,456,232 | B2 | 9/2016 | Yamashita |
| 2004/0244033 | A1 | 12/2004 | Ostensoe et al. |
| 2006/0291507 | A1* | 12/2006 | Sarosi ............... H04N 21/431 370/493 |
| 2009/0087183 | A1* | 4/2009 | Heywood ............ H04J 14/02 398/79 |
| 2011/0205428 | A1 | 8/2011 | Yamashita et al. |
| 2012/0171656 | A1* | 7/2012 | Shen ................. G09B 5/14 434/365 |
| 2017/0094374 | A1* | 3/2017 | Buysschaert ...... H04N 21/6336 |
| 2017/0163929 | A1* | 6/2017 | Maliuk ............... H04N 5/2628 |
| 2017/0201341 | A1* | 7/2017 | Chowdhury ......... H04J 14/04 |
| 2017/0201784 | A1* | 7/2017 | Zdepski ......... H04N 21/23424 |

FOREIGN PATENT DOCUMENTS

| | | | |
|---|---|---|---|
| JP | 0865267 | | 3/1996 |
| JP | 4165587 | B2 | 10/2008 |
| JP | 4746448 | B2 | 8/2011 |
| JP | 4972007 | B2 | 7/2012 |
| JP | 5156983 | B2 | 3/2013 |
| JP | 5192996 | B2 | 5/2013 |
| JP | 5215883 | B2 | 6/2013 |
| JP | 5412663 | B | 2/2014 |
| JP | 5833433 | B2 | 12/2015 |
| KR | 101553928 | | 9/2015 |
| WO | 2016199606 | A1 | 12/2016 |

OTHER PUBLICATIONS

"AFC-HDMI2 Active Fiber Cable", http://emcore.com/blog/infocomm-2015-recap-opticomm-emcores-top-five-products/, Jul. 2, 2015, 6 pages.

"Blackmagic Studio Camera", http://web.archive.org/web/20140410041809/http://www.blackmagicdesign.com/products/blackmagicstudiocamera, Apr. 10, 2014, 11 pages.

"Bluebell Announces Single-Cable 12G-SDI Connectivity for 4K Broadcast Applications", http://www.broadcastingcable.com/thewire/bluebell-announces-single-cable-12g-sdi-connectivity-4k-broadcast-applications/158365, Jul. 26, 2016, 3 pages.

"Optiva OTP-1HDM12-USB-ETH", http://emcore.com/blog/infocomm-2015-recap-opticomm-emcores-top-five-products/, Jul. 2, 2015, 3 pages.

Johnston, Craig, "The Road to 12 Gbps 4K Video Transport", http://www.tvtechnology.com/resources/0006/the-road-to-12-gbps-4k-video-transport/280353, Feb. 21, 2017, 11 pages.

* cited by examiner

SYSTEM AND METHOD FOR PROVIDING SINGLE FIBER 4K VIDEO

CROSS REFERENCE TO RELATED APPLICATIONS

This application is a continuation of U.S. patent application Ser. No. 15/615,303, filed Jun. 6, 2017. All sections of the aforementioned application(s) are incorporated herein by reference in their entirety.

FIELD OF THE DISCLOSURE

The subject disclosure relates to a system and method for providing digital video/audio information from a source device on a single unidirectional fiber optic cable.

BACKGROUND

Ultra-high-definition ("4K") broadcast video signals (sometimes called "quad-link" video) are generally transported from a source device to a presentation device via multiple cables in synchronized streams according to the Advanced Television Systems Committee (ATSC) 1080 p standard.

BRIEF DESCRIPTION OF THE DRAWINGS

Reference will now be made to the accompanying drawings, which are not necessarily drawn to scale, and wherein.

DETAILED DESCRIPTION

Figure 1:
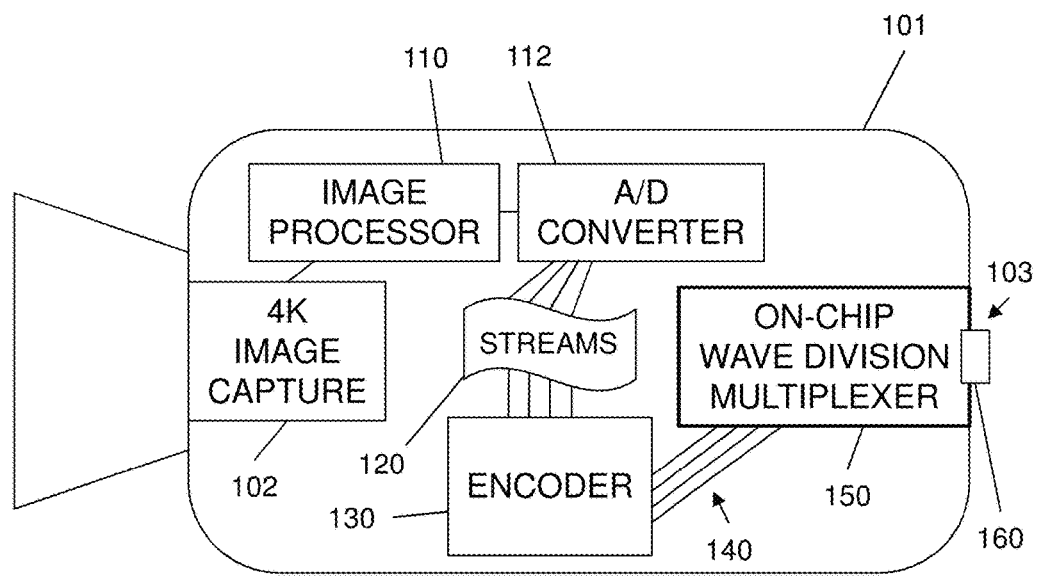
FIG. 1 schematically illustrates a quad-link video camera including a multiplexer, according to an embodiment of the disclosure.

The subject disclosure describes, among other things, illustrative embodiments for delivering video/audio information from a source device having an internal wave division multiplexer (WDM), via a single unidirectional fiber optic cable. Other embodiments are described in the subject disclosure.

One or more aspects of the subject disclosure include a device comprising a processing system including a processor and a memory that stores executable instructions. The instructions, when executed by the processing system, facilitate performance of operations. The operations comprise encoding a plurality of digital signals representing image data captured by a video camera; the encoding is performed by an encoding unit coupled to the video camera, which provides the image data in accordance with a 4K ultra-high definition (4K-UHD) standard. The operations also comprise transmitting the digital signals as a set of four serial digital interface (SDI) streams to a wavelength-division multiplexing (WDM) unit coupled to the encoding unit; the WDM unit performs electrical-to-optical conversion of the SDI streams and outputs a multiplexed signal comprising four wavelengths to a cable connector configured for connecting to a single fiber-optic cable. In one or more embodiments, the video camera, the encoding unit, and the WDM unit form a combined module within a housing having a port formed therein; the cable connector is configured for connecting to a proximal end of the single fiber-optic cable via the port and a distal end of the single fiber-optic cable is configurable for connection to a demultiplexer of a 4K-UHD video presentation device. The multiplexed signal is transmitted on the single fiber-optic cable unidirectionally from the proximal end to the distal end.

One or more aspects of the subject disclosure include a method that comprises receiving, by a processing system including a processor, image data representing images captured by a video camera; generating a plurality of signals representing the image data; and converting the plurality of signals to a plurality of digital streams. The method also comprises performing electrical-to-optical conversion of the digital streams to generate a plurality of optical signals at a plurality of different wavelengths, and multiplexing the optical signals to generate a multiplexed signal comprising the plurality of wavelengths; the multiplexing comprises wavelength-division multiplexing (WDM). The method further comprises transmitting the multiplexed signal via a unidirectional single fiber optic cable to a video presentation device. In one or more embodiments, the electrical-to-optical conversion and the multiplexing are performed at an integrated device; the integrated device and the video camera are internal to a housing with a port formed therein, and the integrated device is coupled to a cable connector configured to connect to a proximal end of the fiber optic cable via the port. The distal end of the fiber optic cable is configured for connection to a demultiplexer of a video presentation device.

One or more aspects of the subject disclosure include a system that comprises a first device for capturing and sending image data; a second device for receiving and presenting the image data; and a single fiber-optic cable connecting the first device and the second device. The first device comprises a first processing system including a first processor and a first memory that stores first executable instructions that, when executed by the first processing system, facilitate performance of operations. The operations comprise encoding a first plurality of digital signals representing the image data captured by a video camera; the encoding is performed by an encoding unit coupled to the video camera, wherein the video camera provides the image data in accordance with a 4K ultra-high definition (4K-UHD) standard. The operations also comprise transmitting the first plurality of digital signals as a set of four serial digital interface (SDI) streams to a wavelength-division multiplexing (WDM) unit coupled to the encoding unit; the WDM unit performs electrical-to-optical conversion of the SDI streams and outputs a multiplexed signal comprising four wavelengths to a first cable connector configured for connecting to the single fiber-optic cable. The video camera, the encoding unit, and the WDM unit form a combined module within a housing of the first device, the housing having a port formed therein, wherein the first cable connector is configured for connecting to a proximal end of the single fiber-optic cable via the port. A distal end of the single fiber-optic cable is configured for connection to a second cable connector of the second device, and the multiplexed signal is transmitted on the single fiber-optic cable unidirectionally from the proximal end to the distal end. The second device comprises a second processing system including a second processor and a second memory that stores second executable instructions that, when executed by the second processing system, facilitate performance of operations. These operations comprise receiving the multiplexed signal at the second cable connector, and transmitting the multiplexed signal to a wavelength-division demultiplexing unit coupled to the second cable connector; the wavelength-division demultiplexing unit provides four optical signals and performs optical-to-electrical conversion of the optical signals to generate a second plurality of digital signals representing the image data for presentation at a display of the second device.

FIG. 1 schematically illustrates a quad-link video camera 100, according to an embodiment of the disclosure. (It is understood that the term "video" as used herein also applies to audio/video or audio signals.) Video images are captured by a camera unit 102 with ultra-high-definition (4K) resolution. Camera 100 also includes an image processor 110, an analog-to-digital (A/D) converter 112, an encoder unit 130, and a multiplexer unit 150. As shown in FIG. 1, these components are within camera body 101. In this embodiment, multiplexer unit 150 comprises an on-chip wave-division multiplexer (WDM) which delivers a multiplexed optical signal to an optical fiber connector 160 at port 103 of the camera body.

The A/D converter 112 outputs four synchronized digital streams 120 to the encoding unit 130. The encoding unit delivers four separate digital signals 140 to the multiplexer unit 150; the output of the multiplexer unit is a combined optical signal delivered to connector 160, which can provide a connection to a single fiber optic cable.

Figure 2:
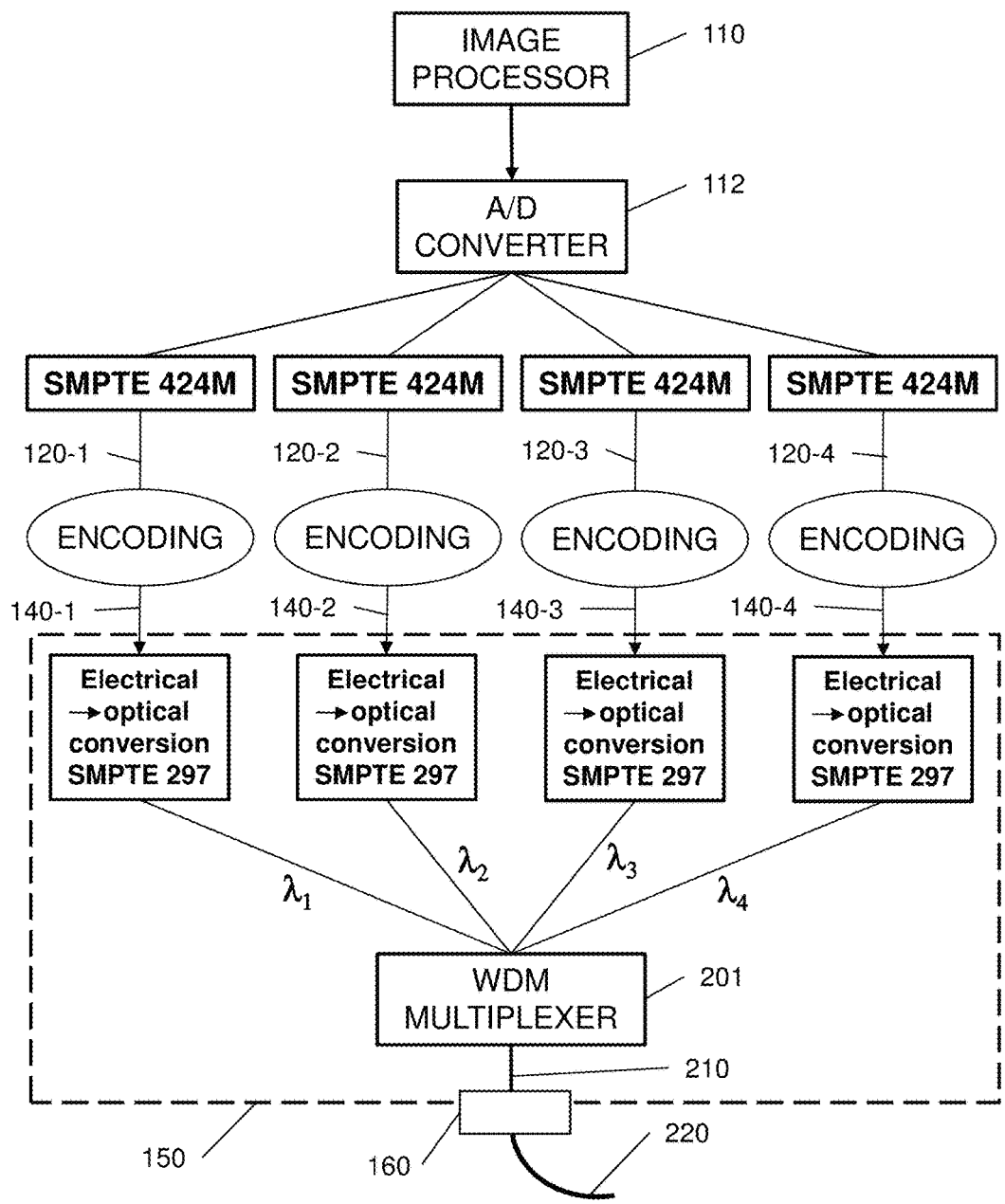
FIG. 2 schematically illustrates encoding and multiplexing of signals in the video camera of FIG. 1.

FIG. 2 is a schematic illustration 200 of video signal processing within the quad-link camera 100, according to an embodiment of the disclosure. The A/D converter 112 receives processed analog video data from image processor 110, and outputs four digital streams 120-1, 120-2, 120-3, 120-4 of video information. In this embodiment, the digital streams are Serial Digital Interface (SDI) streams in accordance with the Society of Motion Picture and Television Engineers (SMPTE) 424M standard. Encoded streams 140-1, 140-2, 140-3, 140-4 are input to the multiplexer unit 150.

In this embodiment, multiplexer unit 150 performs electrical-to-optical conversion on the four inputs; four optical signals at different wavelengths $\lambda_1, \lambda_2, \lambda_3, \lambda_4$ are transmitted to the WDM multiplexer 201 in accordance with SMPTE standard 297. The output 210 of the multiplexer is an optical signal with combined wavelengths, delivered to connector 160. As shown schematically in FIG. 2, a single fiber optic cable 220 connects to connector 160.

In an embodiment, the video camera unit 102, the image processor 110, the A/D converter 112, the encoding unit 130, and the WDM multiplexer 201 form a combined module within the housing 101. In a particular embodiment, the WDM multiplexer and four electrical/optical converters form an integrated device having four electrical inputs and one optical output.

Figure 3:
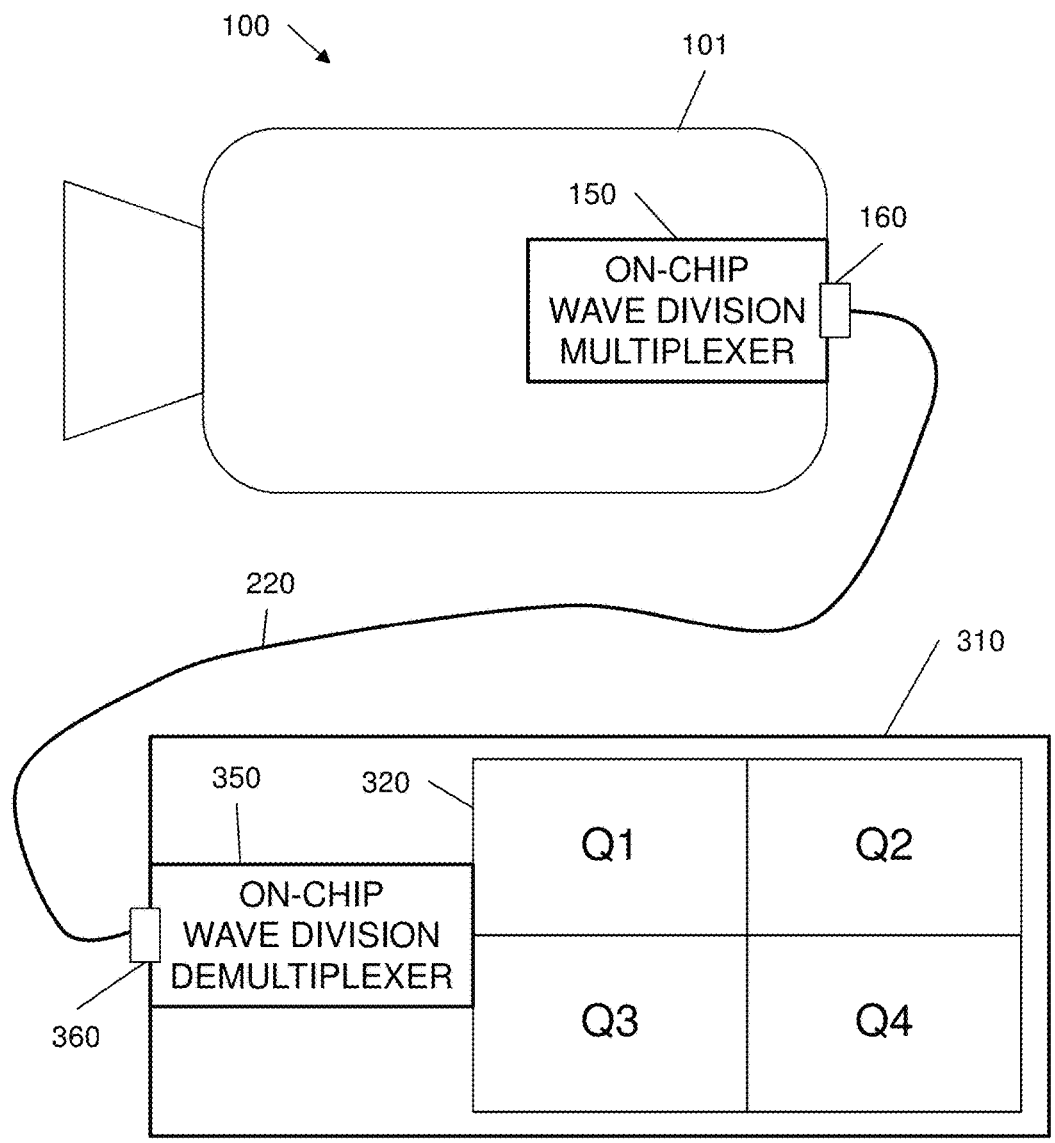
FIG. 3 schematically illustrates a quad-link video system including a camera, a fiber optic cable and a display device, in accordance with an embodiment of the disclosure.

FIG. 3 schematically illustrates a 4K video presentation system 300 in accordance with an embodiment of the disclosure. System 300 includes camera 100 and quad-link display device 310, connected by fiber optic cable 220. Cable 220 is a unidirectional fiber optic cable, connecting to connector 160 of camera 100 and connector 360 of display device 310. A WDM demultiplexer unit 350 receives the multiplexed optical signal via connector 360; the demultiplexed video signals are presented at the four quadrants Q1, Q2, Q3, Q4 of screen 320. As shown in FIG. 3, the demultiplexer unit 350 is internal to the display device. In an embodiment, the WDM demultiplexer and four electrical/optical converters form an integrated device having one optical input and four electrical outputs.

Figure 4:
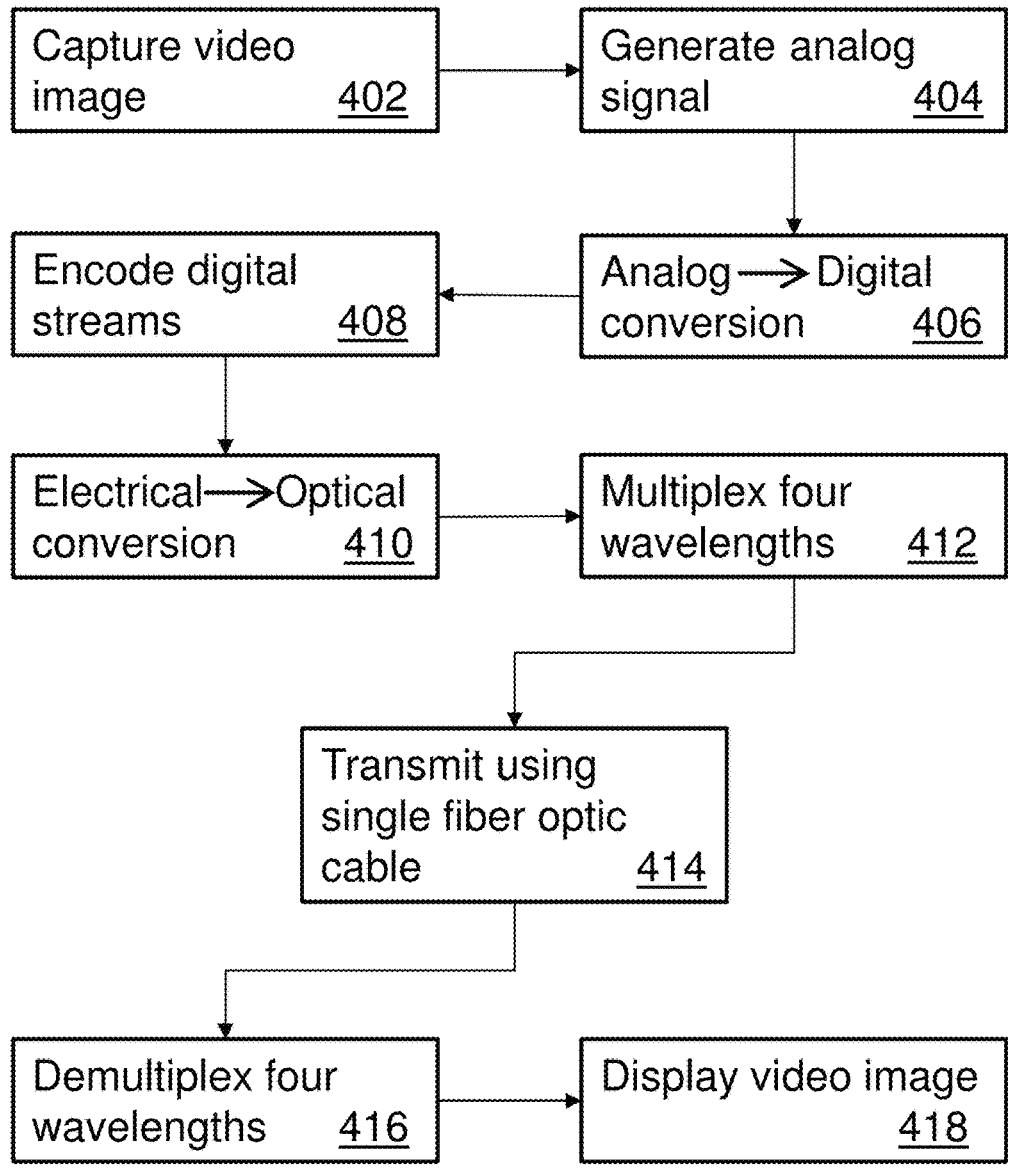
FIG. 4 depicts an illustrative embodiment of a method used in portions of the system described in FIG. 3.

FIG. 4 is a flowchart showing a method 400 for processing and transmitting quad-link video, in accordance with an embodiment of the disclosure. In this embodiment, steps 402-412 are performed by, and within, camera 100, and steps 416-418 are performed by display device 310.

In step 402, the video camera unit captures video images; analog signals corresponding to the video information are generated (step 404) and then converted to digital streams (step 406). The digital streams are encoded (step 408) and input to the multiplexer unit, where electrical/optical conversion is performed (step 410). Optical signals at four different wavelengths are then multiplexed at the WDM multiplexer (step 412).

The output of the multiplexer is transmitted to the display device 310 using a unidirectional fiber-optic cable (step 414). The multiplexed video signal is demultiplexed (step 416) by a WDM demultiplexer within the display device. The demultiplexed video streams are then presented at the display screen 320.

While for purposes of simplicity of explanation, the respective processes are shown and described as a series of blocks in FIG. 4, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 5:
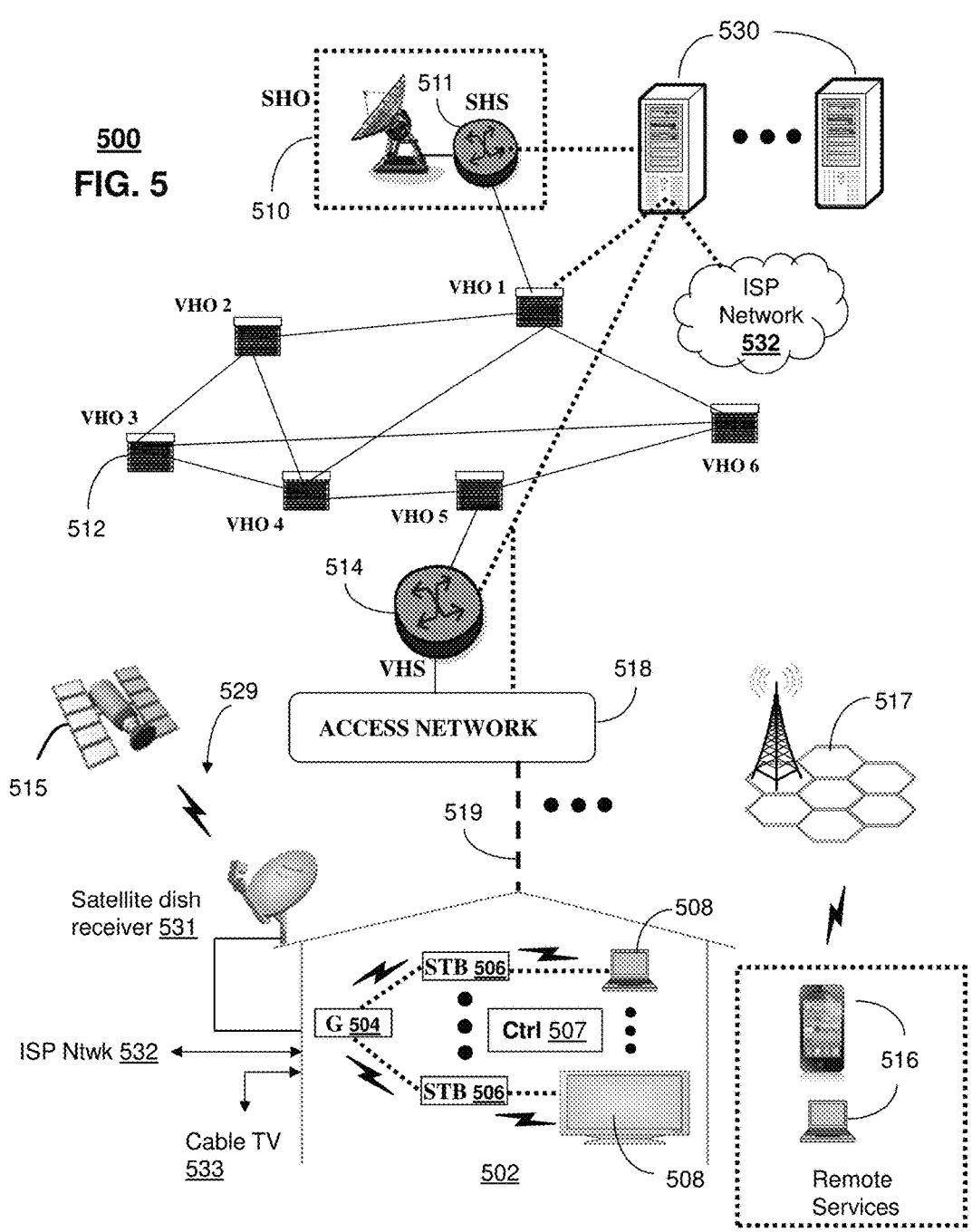
FIGS. 5-6 depict illustrative embodiments of communication systems that provide media services, which may be integrated with or communicate with the system of FIG. 3.

FIG. 5 depicts an illustrative embodiment of a communication system 500 for providing various communication services, such as delivering media content. The communication system 500 can represent an interactive media network, such as an interactive television system (e.g., an Internet Protocol Television (IPTV) media system). Communication system 500 can be overlaid or operably coupled with system 300 of FIG. 3 as another representative embodiment of communication system 500. For instance, one or more devices illustrated in the communication system 500 of FIG. 5 can comprise a processing system including a processor and a memory that stores executable instructions; the instructions, when executed by the processing system, facilitate performance of operations. The operations can comprise encoding a plurality of digital signals representing image data captured by a video camera; the encoding can be performed by an encoding unit coupled to the video camera, which provides the image data in accordance with a 4K ultra-high definition (4K-UHD) standard. The operations can also comprise transmitting the digital signals as a set of four serial digital interface (SDI) streams to a wavelength-division multiplexing (WDM) unit coupled to the encoding unit; the WDM unit can perform electrical-to-optical conversion of the SDI streams and can output a multiplexed signal comprising four wavelengths to a cable connector configured for connecting to a single fiber-optic cable. In one or more embodiments, the video camera, the encoding unit, and the WDM unit can form a combined module within a housing having a port formed therein; the cable connector can be configured for connecting to a proximal end of the single fiber-optic cable via the port, and a distal end of the single fiber-optic cable can be configurable for connection to a demultiplexer of a 4K-UHD video presentation device. The multiplexed signal can be transmitted on the single fiber-optic cable unidirectionally from the proximal end to the distal end.

In one or more embodiments, the communication system 500 can include a super head-end office (SHO) 510 with at least one super headend office server (SHS) 511 which receives media content from satellite and/or terrestrial communication systems. In the present context, media content can represent, for example, audio content, moving image content such as 2D or 3D videos, video games, virtual reality content, still image content, and combinations thereof. The SHS server 511 can forward packets associated with the media content to one or more video head-end servers (VHS) 514 via a network of video head-end offices (VHO) 512 according to a multicast communication protocol. The VHS 514 can distribute multimedia broadcast content via an access network 518 to commercial and/or residential buildings 502 housing a gateway 504 (such as a residential or commercial gateway).

The access network 518 can represent a group of digital subscriber line access multiplexers (DSLAMs) located in a central office or a service area interface that provide broadband services over fiber optical links or copper twisted pairs 519 to buildings 502. The gateway 504 can use communication technology to distribute broadcast signals to media processors 506 such as Set-Top Boxes (STBs) which in turn present broadcast channels to media devices 508 such as computers or television sets managed in some instances by a media controller 507 (such as an infrared or RF remote controller).

The gateway 504, the media processors 506, and media devices 508 can utilize tethered communication technologies (such as coaxial, powerline or phone line wiring) or can operate over a wireless access protocol such as Wireless Fidelity (WiFi), Bluetooth®, Zigbee or other present or next generation local or personal area wireless network technologies. By way of these interfaces, unicast communications can also be invoked between the media processors 506 and subsystems of the IPTV media system for services such as video-on-demand (VoD), browsing an electronic programming guide (EPG), or other infrastructure services.

A satellite broadcast television system 529 can be used in the media system of FIG. 5. The satellite broadcast television system can be overlaid, operably coupled with, or replace the IPTV system as another representative embodiment of communication system 500. In this embodiment, signals transmitted by a satellite 515 that include media content can be received by a satellite dish receiver 531 coupled to the building 502. Modulated signals received by the satellite dish receiver 531 can be transferred to the media processors 506 for demodulating, decoding, encoding, and/or distributing broadcast channels to the media devices 508. The media processors 506 can be equipped with a broadband port to an Internet Service Provider (ISP) network 532 to enable interactive services such as VoD and EPG as described above.

In yet another embodiment, an analog or digital cable broadcast distribution system such as cable TV system 533 can be overlaid, operably coupled with, or replace the IPTV system and/or the satellite TV system as another representative embodiment of communication system 500. In this embodiment, the cable TV system 533 can also provide Internet, telephony, and interactive media services. System 500 enables various types of interactive television and/or services including IPTV, cable and/or satellite.

The subject disclosure can apply to other present or next generation over-the-air and/or landline media content services system.

Some of the network elements of the IPTV media system can be coupled to one or more computing devices 530, a portion of which can operate as a web server for providing web portal services over the ISP network 532 to wireline media devices 508 or wireless communication devices 516.

Communication system 500 can also provide for all or a portion of the computing devices 530 to function as a server. The media processors 506 and wireless communication devices 516 can be provisioned with software functions to utilize the services of server 530.

Multiple forms of media services can be offered to media devices over landline technologies such as those described above. Additionally, media services can be offered to media devices by way of a wireless access base station 517 operating according to common wireless access protocols such as Global System for Mobile or GSM, Code Division Multiple Access or CDMA, Time Division Multiple Access or TDMA, Universal Mobile Telecommunications or UMTS, World interoperability for Microwave or WiMAX, Software Defined Radio or SDR, Long Term Evolution or LTE, and so on. Other present and next generation wide area wireless access network technologies can be used in one or more embodiments of the subject disclosure.

Figure 6:
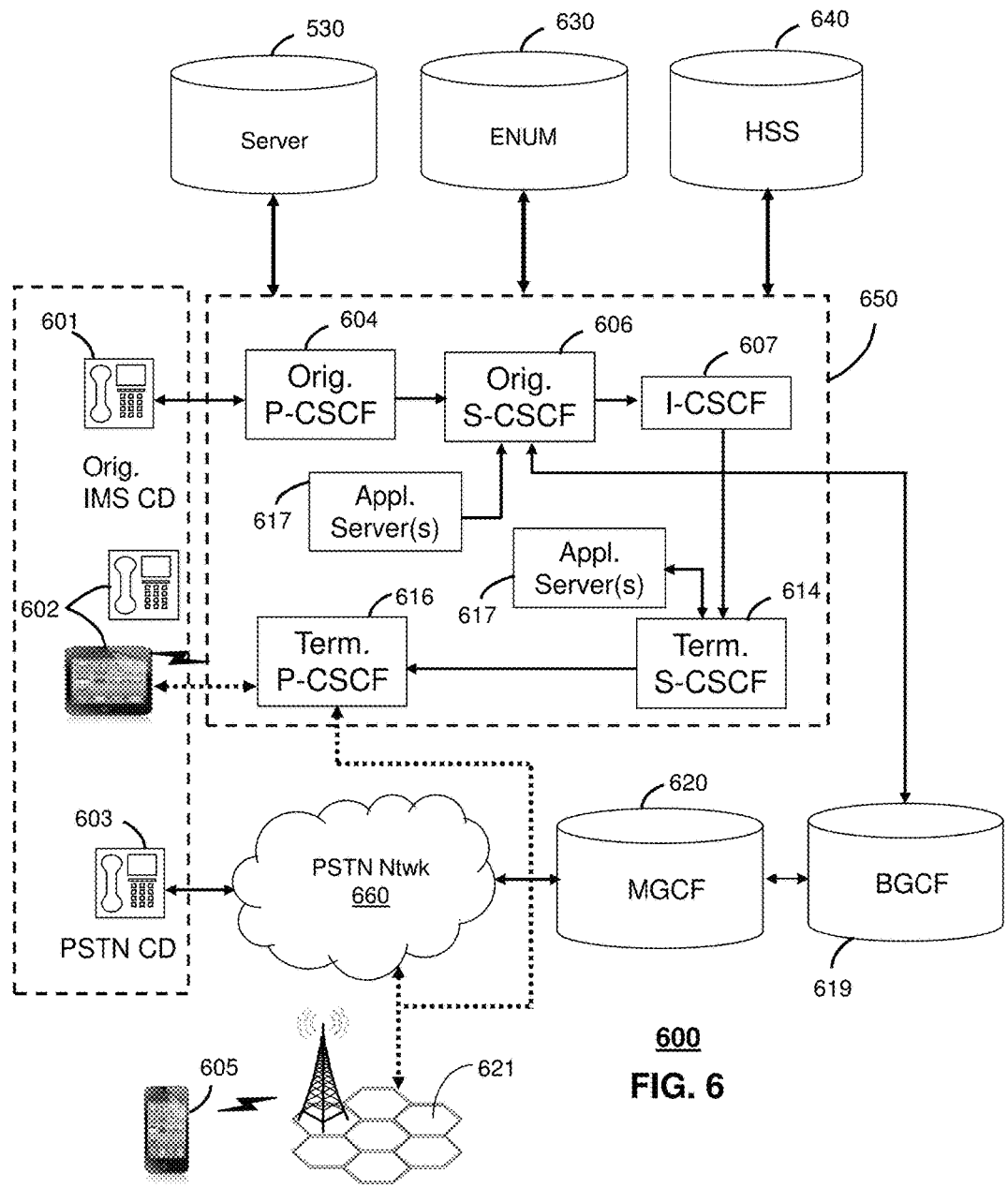

FIG. 6 depicts an illustrative embodiment of a communication system 600 employing an IP Multimedia Subsystem (IMS) network architecture to facilitate the combined services of circuit-switched and packet-switched systems. Communication system 600 can be overlaid or operably coupled with system 300 of FIG. 3 and communication system 500 as another representative embodiment of communication system 500. In particular, such an embodiment can perform a method that comprises receiving, by a processing system including a processor, image data representing images captured by a video camera; generating a plurality of signals representing the image data; and converting the plurality of signals to a plurality of digital streams. The method can also comprise performing electrical-to-optical conversion of the digital streams to generate a plurality of optical signals at a plurality of different wavelengths, and multiplexing the optical signals to generate a multiplexed signal comprising the plurality of wavelengths; the multiplexing can comprise wavelength-division multiplexing (WDM). The method can further comprise transmitting the multiplexed signal via a unidirectional single fiber optic cable to a video presentation device. In one or more embodiments, the electrical-to-optical conversion and the multiplexing can be performed at an integrated device, where the integrated device and the video camera are internal to a housing with a port formed therein, and the integrated device is coupled to a cable connector configured to connect to a proximal end of the fiber optic cable via the port. The distal end of the fiber optic cable can be configured for connection to a demultiplexer of a video presentation device.

Communication system 600 can comprise a Home Subscriber Server (HSS) 640, a tElephone NUmber Mapping (ENUM) server 630, and other network elements of an IMS network 650. The IMS network 650 can establish communications between IMS-compliant communication devices (CDs) 601, 602, Public Switched Telephone Network (PSTN) CDs 603, 605, and combinations thereof by way of a Media Gateway Control Function (MGCF) 620 coupled to a PSTN network 660. The MGCF 620 need not be used when a communication session involves IMS CD to IMS CD communications. A communication session involving at least one PSTN CD may utilize the MGCF 620.

IMS CDs 601, 602 can register with the IMS network 650 by contacting a Proxy Call Session Control Function (P-CSCF) which communicates with an interrogating CSCF (I-CSCF), which in turn, communicates with a Serving CSCF (S-CSCF) to register the CDs with the HSS 640. To initiate a communication session between CDs, an originating IMS CD 601 can submit a Session Initiation Protocol (SIP INVITE) message to an originating P-CSCF 604 which communicates with a corresponding originating S-CSCF 606. The originating S-CSCF 606 can submit the SIP INVITE message to one or more application servers (ASs) 617 that can provide a variety of services to IMS subscribers.

For example, the application servers 617 can be used to perform originating call feature treatment functions on the calling party number received by the originating S-CSCF 606 in the SIP INVITE message. Originating treatment functions can include determining whether the calling party number has international calling services, call ID blocking, calling name blocking, 7-digit dialing, and/or is requesting special telephony features (e.g., *72 forward calls, *73 cancel call forwarding, *67 for caller ID blocking, and so on). Based on initial filter criteria (iFCs) in a subscriber profile associated with a CD, one or more application servers may be invoked to provide various call originating feature services.

Additionally, the originating S-CSCF 606 can submit queries to the ENUM system 630 to translate an E.164 telephone number in the SIP INVITE message to a SIP Uniform Resource Identifier (URI) if the terminating communication device is IMS-compliant. The SIP URI can be used by an Interrogating CSCF (I-CSCF) 607 to submit a query to the HSS 640 to identify a terminating S-CSCF 614 associated with a terminating IMS CD such as reference 602. Once identified, the I-CSCF 607 can submit the SIP INVITE message to the terminating S-CSCF 614. The terminating S-CSCF 614 can then identify a terminating P-CSCF 616 associated with the terminating CD 602. The P-CSCF 616 may then signal the CD 602 to establish Voice over Internet Protocol (VoIP) communication services, thereby enabling the calling and called parties to engage in voice and/or data communications. Based on the iFCs in the subscriber profile, one or more application servers may be invoked to provide various call terminating feature services, such as call forwarding, do not disturb, music tones, simultaneous ringing, sequential ringing, etc.

In some instances the aforementioned communication process is symmetrical. Accordingly, the terms "originating" and "terminating" in FIG. 6 may be interchangeable. It is further noted that communication system 600 can be adapted to support video conferencing. In addition, communication system 600 can be adapted to provide the IMS CDs 601, 602 with the multimedia and Internet services of communication system 500 of FIG. 5.

If the terminating communication device is instead a PSTN CD such as CD 603 or CD 605 (in instances where the cellular phone only supports circuit-switched voice communications), the ENUM system 630 can respond with an unsuccessful address resolution which can cause the originating S-CSCF 606 to forward the call to the MGCF 620 via a Breakout Gateway Control Function (BGCF) 619. The MGCF 620 can then initiate the call to the terminating PSTN CD over the PSTN network 660 to enable the calling and called parties to engage in voice and/or data communications.

It is further appreciated that the CDs of FIG. 6 can operate as wireline or wireless devices. For example, the CDs of FIG. 6 can be communicatively coupled to a cellular base station 621, a femtocell, a WiFi router, a Digital Enhanced Cordless Telecommunications (DECT) base unit, or another suitable wireless access unit to establish communications with the IMS network 650 of FIG. 6. The cellular access base station 621 can operate according to common wireless access protocols such as GSM, CDMA, TDMA, UMTS, WiMax, SDR, LTE, and so on. Other present and next generation wireless network technologies can be used by one or more embodiments of the subject disclosure. Accordingly, multiple wireline and wireless communication technologies can be used by the CDs of FIG. 6.

Cellular phones supporting LTE can support packet-switched voice and packet-switched data communications and thus may operate as IMS-compliant mobile devices. In this embodiment, the cellular base station 621 may communicate directly with the IMS network 650 as shown by the arrow connecting the cellular base station 621 and the P-CSCF 616.

Alternative forms of a CSCF can operate in a device, system, component, or other form of centralized or distributed hardware and/or software. Indeed, a respective CSCF may be embodied as a respective CSCF system having one or more computers or servers, either centralized or distributed, where each computer or server may be configured to perform or provide, in whole or in part, any method, step, or functionality described herein in accordance with a respective CSCF. Likewise, other functions, servers and computers described herein, including but not limited to, the HSS, the ENUM server, the BGCF, and the MGCF, can be embodied in a respective system having one or more computers or servers, either centralized or distributed, where each computer or server may be configured to perform or provide, in whole or in part, any method, step, or functionality described herein in accordance with a respective function, server, or computer.

The server 530 of FIG. 5 can be operably coupled to communication system 600 for purposes similar to those described above. Server 530 can provide services to the CDs 601, 602, 603 and 605 of FIG. 6, which can be adapted with software to utilize the services of the server 530. Server 530 can be an integral part of the application server(s) 617, which can be adapted to the operations of the IMS network 650.

For illustration purposes only, the terms S-CSCF, P-CSCF, I-CSCF, and so on, can be server devices, but may be referred to in the subject disclosure without the word "server." It is also understood that any form of a CSCF server can operate in a device, system, component, or other form of centralized or distributed hardware and software. It is further noted that these terms and other terms such as DIAMETER commands are terms can include features, methodologies, and/or fields that may be described in whole or in part by standards bodies such as $3^{rd}$ Generation Partnership Project (3GPP). It is further noted that some or all embodiments of the subject disclosure may in whole or in part modify, supplement, or otherwise supersede final or proposed standards published and promulgated by 3GPP.

Figure 7:
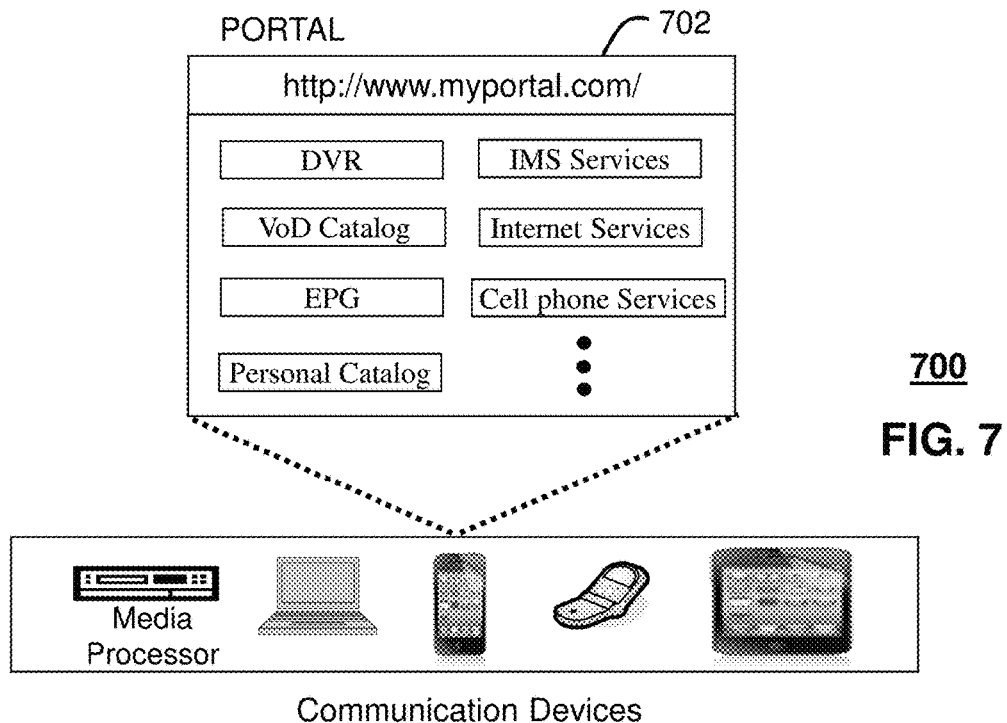
FIG. 7 depicts an illustrative embodiment of a web portal for interacting with the communication systems of FIGS. 5-6.

FIG. 7 depicts an illustrative embodiment of a web portal 702 of a communication system 700. Communication system 700 can be overlaid or operably coupled with system 300 of FIG. 3, communication system 500, and/or communication system 600 as another representative embodiment of system 300 of FIG. 3, communication system 500, and/or communication system 600. The web portal 702 can be used for managing services of system 300 of FIG. 3 and communication systems 500-600. A web page of the web portal 702 can be accessed by a Uniform Resource Locator (URL) with an Internet browser using an Internet-capable communication device such as those described in FIGS. 5-6. The web portal 702 can be configured, for example, to access a media processor 506 and services managed thereby such as a Digital Video Recorder (DVR), a Video on Demand (VoD) catalog, an Electronic Programming Guide (EPG), or a personal catalog (such as personal videos, pictures, audio recordings, etc.) stored at the media processor 506. The web portal 702 can also be used for provisioning IMS services described earlier, provisioning Internet services, provisioning cellular phone services, and so on.

The web portal 702 can further be utilized to manage and provision software applications to adapt these applications as may be desired by subscribers and/or service providers of communication systems 500-600. For instance, users of the services provided by server 530 can log into their on-line accounts and provision server 530 with user profiles, contact information to enable communication with devices described in FIGS. 5-6, and so on. Service providers can log onto an administrator account to provision, monitor and/or maintain server 530.

Figure 8:
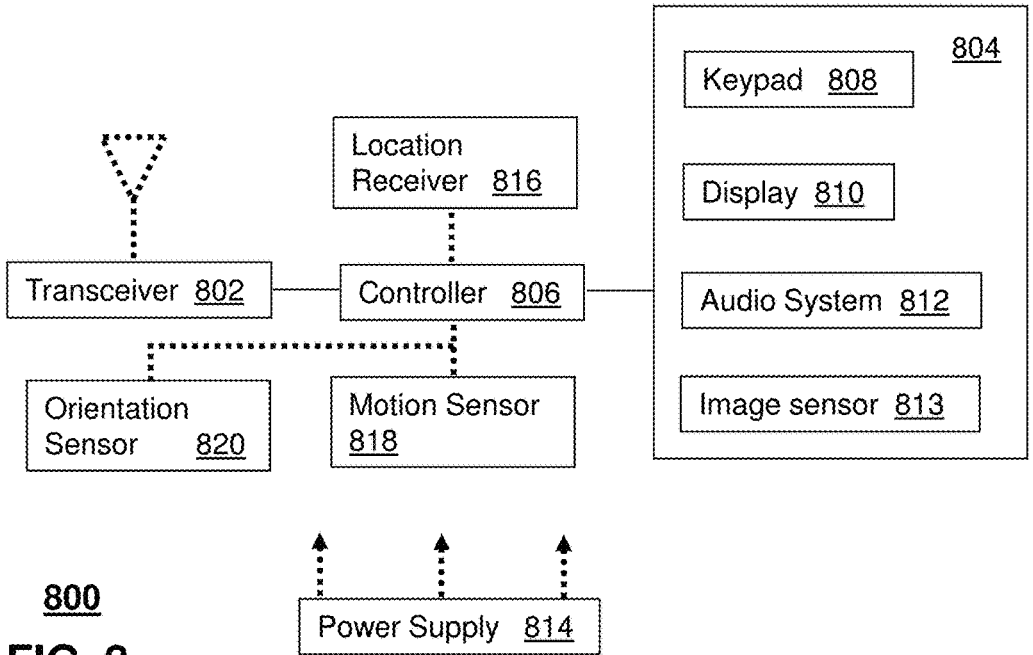
FIG. 8 depicts an illustrative embodiment of a communication device.

FIG. 8 depicts an illustrative embodiment of a communication device 800. Communication device 800 can serve in whole or in part as an illustrative embodiment of the devices depicted in FIGS. 5-6.

Communication device 800 can comprise a wireline and/or wireless transceiver 802 (herein transceiver 802), a user interface (UI) 804, a power supply 814, a location receiver 816, a motion sensor 818, an orientation sensor 820, and a controller 806 for managing operations thereof. The transceiver 802 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1x, UMTS/HSDPA, GSM/GPRS, TDMA/EDGE, EV/DO, WiMAX, SDR, LTE, as well as other next generation wireless communication technologies as they arise. The transceiver 802 can also be adapted to support circuit-switched wireline access technologies (such as PSTN), packet-switched wireline access technologies (such as TCP/IP, VoIP, etc.), and combinations thereof.

The UI 804 can include a depressible or touch-sensitive keypad 808 with a navigation mechanism such as a roller ball, a joystick, a mouse, or a navigation disk for manipulating operations of the communication device 800. The keypad 808 can be an integral part of a housing assembly of the communication device 800 or an independent device operably coupled thereto by a tethered wireline interface (such as a USB cable) or a wireless interface supporting for example Bluetooth®. The keypad 808 can represent a numeric keypad commonly used by phones, and/or a QWERTY keypad with alphanumeric keys. The UI 804 can further include a display 810 such as monochrome or color LCD (Liquid Crystal Display), OLED (Organic Light Emitting Diode) or other suitable display technology for conveying images to an end user of the communication device 800. In an embodiment where the display 810 is touch-sensitive, a portion or all of the keypad 808 can be presented by way of the display 810 with navigation features.

The display 810 can use touch screen technology to also serve as a user interface for detecting user input. As a touch screen display, the communication device 800 can be adapted to present a user interface with graphical user interface (GUI) elements that can be selected by a user with a touch of a finger. The touch screen display 810 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 810 can be an integral part of the housing assembly of the communication device 800 or an independent device communicatively coupled thereto by a tethered wireline interface (such as a cable) or a wireless interface.

The UI 804 can also include an audio system 812 that utilizes audio technology for conveying low volume audio (such as audio heard in proximity of a human ear) and high volume audio (such as speakerphone for hands free operation). The audio system 812 can further include a microphone for receiving audible signals of an end user. The audio system 812 can also be used for voice recognition applications. The UI 804 can further include an image sensor 813 such as a charged coupled device (CCD) camera for capturing still or moving images.

The power supply 814 can utilize common power management technologies such as replaceable and rechargeable batteries, supply regulation technologies, and/or charging system technologies for supplying energy to the components of the communication device 800 to facilitate long-range or short-range portable applications. Alternatively, or in combination, the charging system can utilize external power sources such as DC power supplied over a physical interface such as a USB port or other suitable tethering technologies.

The location receiver 816 can utilize location technology such as a global positioning system (GPS) receiver capable of assisted GPS for identifying a location of the communication device 800 based on signals generated by a constellation of GPS satellites, which can be used for facilitating location services such as navigation. The motion sensor 818 can utilize motion sensing technology such as an accelerometer, a gyroscope, or other suitable motion sensing technology to detect motion of the communication device 800 in three-dimensional space. The orientation sensor 820 can utilize orientation sensing technology such as a magnetometer to detect the orientation of the communication device 800 (north, south, west, and east, as well as combined orientations in degrees, minutes, or other suitable orientation metrics).

The communication device 800 can use the transceiver 802 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 806 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 800.

Other components not shown in FIG. 8 can be used in one or more embodiments of the subject disclosure. For instance, the communication device 800 can include a reset button (not shown). The reset button can be used to reset the controller 806 of the communication device 800. In yet another embodiment, the communication device 800 can also include a factory default setting button positioned, for example, below a small hole in a housing assembly of the communication device 800 to force the communication device 800 to re-establish factory settings. In this embodiment, a user can use a protruding object such as a pen or paper clip tip to reach into the hole and depress the default setting button. The communication device 800 can also include a slot for adding or removing an identity module such as a Subscriber Identity Module (SIM) card. SIM cards can be used for identifying subscriber services, executing programs, storing subscriber data, and so forth.

The communication device 800 as described herein can operate with more or less of the circuit components shown in FIG. 8. These variant embodiments can be used in one or more embodiments of the subject disclosure.

The communication device 800 can be adapted to perform the functions of the media processor 506, the media devices 508, or the portable communication devices 516 of FIG. 5, as well as the IMS CDs 601-602 and PSTN CDs 603-605 of FIG. 6. It will be appreciated that the communication device 800 can also represent other devices that can operate in communication systems 500-600 of FIGS. 4-5 such as a gaming console and a media player.

Upon reviewing the aforementioned embodiments, it would be evident to an artisan with ordinary skill in the art that said embodiments can be modified, reduced, or enhanced without departing from the scope of the claims described below. For example, the wavelengths $\lambda_1$, $\lambda_2$, $\lambda_3$, $\lambda_4$ used internally in the multiplexer unit 150 can be selected to provide optimal bit rates. In addition, the encoding unit 130 can perform J2K coding, Advanced Video Coding (AVC), or High Efficiency Video Coding (HEVC) to minimize bandwidth and traffic on the unidirectional fiber cable 220. Other embodiments can be used in the subject disclosure.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Figure 9:
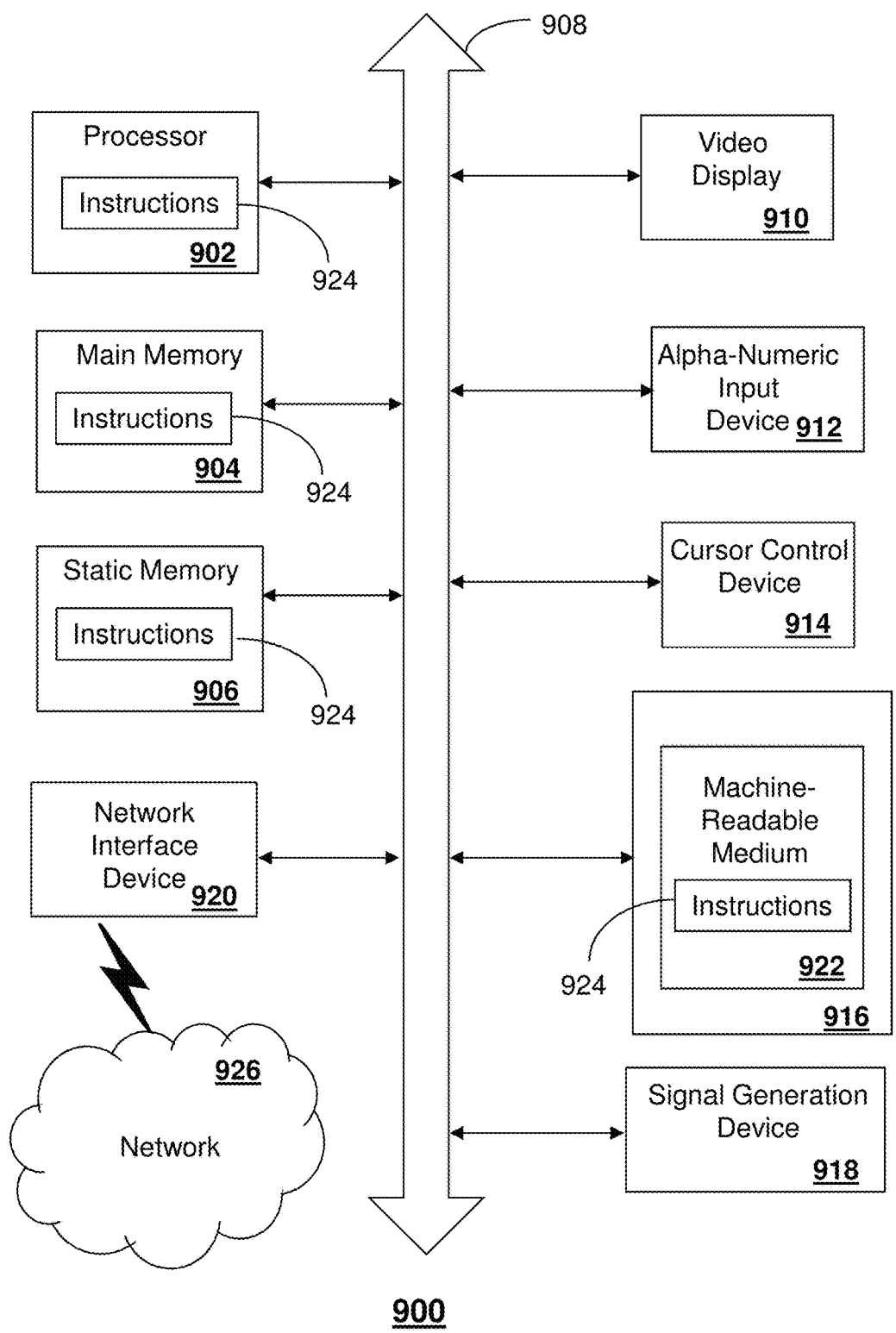
FIG. 9 is a diagrammatic representation of a machine in the form of a computer system within which a set of instructions, when executed, may cause the machine to perform any one or more of the methods described herein.

FIG. 9 depicts an exemplary diagrammatic representation of a machine in the form of a computer system 900 within which a set of instructions, when executed, may cause the machine to perform any one or more of the methods described above. One or more instances of the machine can operate, for example, as the server 530, the media processor 506, the image processor 110, and other devices of FIGS. 1-3. In some embodiments, the machine may be connected (e.g., using a network 926) to other machines. In a networked deployment, the machine may operate in the capacity of a server or a client user machine in a server-client user network environment, or as a peer machine in a peer-to-peer (or distributed) network environment.

The machine may comprise a server computer, a client user computer, a personal computer (PC), a tablet, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 900 may include a processor (or controller) 902 (e.g., a central processing unit (CPU)), a graphics processing unit (GPU, or both), a main memory 904 and a static memory 906, which communicate with each other via a bus 908. The computer system 900 may further include a display unit 910 (e.g., a liquid crystal display (LCD), a flat panel, or a solid state display). The computer system 900 may include an input device 912 (e.g., a keyboard), a cursor control device 914 (e.g., a mouse), a disk drive unit 916, a signal generation device 918 (e.g., a speaker or remote control) and a network interface device 920. In distributed environments, the embodiments described in the subject disclosure can be adapted to utilize multiple display units 910 controlled by two or more computer systems 900. In this configuration, presentations described by the subject disclosure may in part be shown in a first of the display units 910, while the remaining portion is presented in a second of the display units 910.

The disk drive unit 916 may include a tangible computer-readable storage medium 922 on which is stored one or more sets of instructions (e.g., software 924) embodying any one or more of the methods or functions described herein, including those methods illustrated above. The instructions 924 may also reside, completely or at least partially, within the main memory 904, the static memory 906, and/or within the processor 902 during execution thereof by the computer system 900. The main memory 904 and the processor 902 also may constitute tangible computer-readable storage media.

Dedicated hardware implementations including, but not limited to, application specific integrated circuits, programmable logic arrays and other hardware devices can likewise be constructed to implement the methods described herein. Application specific integrated circuits and programmable logic array can use downloadable instructions for executing state machines and/or circuit configurations to implement embodiments of the subject disclosure. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the operations or methods described herein are intended for operation as software programs or instructions running on or executed by a computer processor or other computing device, and which may include other forms of instructions manifested as a state machine implemented with logic components in an application specific integrated circuit or field programmable gate array. Furthermore, software implementations (e.g., software programs, instructions, etc.)

including, but not limited to, distributed processing or component/object distributed processing, parallel processing, or virtual machine processing can also be constructed to implement the methods described herein. Distributed processing environments can include multiple processors in a single machine, single processors in multiple machines, and/or multiple processors in multiple machines. It is further noted that a computing device such as a processor, a controller, a state machine or other suitable device for executing instructions to perform operations or methods may perform such operations directly or indirectly by way of one or more intermediate devices directed by the computing device.

While the tangible computer-readable storage medium 922 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure. The term "non-transitory" as in a non-transitory computer-readable storage includes without limitation memories, drives, devices and anything tangible but not a signal per se.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth®, WiFi, Zigbee®), and long-range communications (e.g., WiMAX, GSM, CDMA, LTE) can be used by computer system 900. In one or more embodiments, information regarding use of services can be generated including services being accessed, media consumption history, user preferences, and so forth. This information can be obtained by various methods including user input, detecting types of communications (e.g., video content vs. audio content), analysis of content streams, and so forth. The generating, obtaining and/or monitoring of this information can be responsive to an authorization provided by the user. In one or more embodiments, an analysis of data can be subject to authorization from user(s) associated with the data, such as an opt-in, an opt-out, acknowledgement requirements, notifications, selective authorization based on types of data, and so forth.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. The exemplary embodiments can include combinations of features and/or steps from multiple embodiments. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

In one or more embodiments, a processor (which can include a controller or circuit) has been described that performs various functions. It should be understood that the processor can be multiple processors, which can include distributed processors or parallel processors in a single machine or multiple machines. The processor can be used in supporting a virtual processing environment. The virtual processing environment may support one or more virtual machines representing computers, servers, or other computing devices. In such virtual machines, components such as microprocessors and storage devices may be virtualized or logically represented. The processor can include a state machine, application specific integrated circuit, and/or programmable gate array including a Field PGA. In one or more embodiments, when a processor executes instructions to perform "operations", this can include the processor performing the operations directly and/or facilitating, directing, or cooperating with another device or component to perform the operations.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A device comprising:
a processing system including a processor; and
a memory that stores executable instructions that, when executed by the processing system, facilitate performance of operations comprising:
encoding a plurality of digital signals representing image data captured by a video camera, wherein the encoding is performed by an encoding unit coupled to the video camera; and
transmitting the digital signals as a set of four serial digital interface (SDI) streams to a wavelength-division multiplexing (WDM) unit coupled to the encoding unit, wherein the WDM unit performs electrical-to-optical conversion of the digital signals and outputs a multiplexed signal comprising a plurality of wavelengths to a cable connector,
wherein the cable connector is configured for connecting to a proximal end of a single fiber-optic cable, a distal end of the single fiber-optic cable being configurable for connection to a demultiplexer of a video presentation device,
wherein the multiplexed signal is transmitted on the single fiber-optic cable unidirectionally from the proximal end to the distal end,
wherein the video camera provides the image data in accordance with a 4K ultra-high definition (4K-UHD) standard.

2. The device of claim 1, wherein the video camera, the encoding unit, and the WDM unit form a combined module within a housing.

3. The device of claim 2, wherein the housing has a port formed therein.

4. The device of claim 3, wherein the cable connector is configured for connecting to the proximal end of the single fiber-optic cable via the port.

5. The device of claim 1, wherein the video camera comprises an image processing unit and an analog-to-digital (A/D) converter.

6. The device of claim 5, wherein the image processing unit provides an analog video signal to the A/D converter, and wherein the A/D converter provides the plurality of digital signals to the encoding unit.

7. The device of claim 5, wherein the A/D converter provides four digital signals in accordance with the SMPTE 424M standard.

8. The device of claim 1, wherein the WDM unit includes four electrical-to-optical conversion devices, and wherein each of the electrical-to-optical conversion devices outputs a different wavelength.

9. A method comprising:
receiving, by a processing system including a processor, image data representing images captured by a video camera;
generating, by the processing system, a plurality of signals representing the image data;
performing, by the processing system, electrical-to-optical conversion of the plurality of signals to generate a plurality of optical signals at a plurality of different wavelengths, wherein the plurality of optical signals includes four optical signals at the plurality of different wavelengths;
multiplexing, by the processing system, the plurality of optical signals to generate a multiplexed signal comprising the plurality of wavelengths; and
transmitting, by the processing system, the multiplexed signal via a unidirectional single fiber optic cable,
wherein the image data is in accordance with a 4K ultra-high definition (4K-UHD) standard.

10. The method of claim 9, further comprising:
converting, by the processing system, the plurality of signals to a plurality of digital streams,
wherein the performing comprises electrical-to-optical conversion of the digital streams to generate the plurality of optical signals.

11. The method of claim 10, wherein the plurality of digital streams comprises four serial digital interface (SDI) streams.

12. The method of claim 9, wherein the multiplexing comprises wavelength division multiplexing (WDM).

13. The method of claim 9, wherein the transmitting comprises transmitting the multiplexed signal to a video presentation device.

14. The method of claim 9, wherein the electrical-to-optical conversion and the multiplexing are performed at an integrated device, the integrated device and the video camera being internal to a housing with a port formed therein.

15. The method of claim 14, wherein the integrated device is coupled to a cable connector configured to connect to a proximal end of the fiber optic cable via the port.

16. The method of claim 15, wherein a distal end of the fiber optic cable is configured for connection to a demultiplexer of a video presentation device.

17. A system comprising:
a first device for capturing and sending image data;
a second device for receiving and presenting the image data; and
a single fiber-optic cable connecting the first device and the second device,
wherein the first device comprises a first processing system including a first processor and a first memory that stores first executable instructions that, when executed by the first processing system, facilitate performance of operations comprising:
encoding a first plurality of digital signals representing the image data captured by a video camera, wherein the encoding is performed by an encoding unit coupled to the video camera, wherein the video camera provides the image data in accordance with a high resolution standard; and transmitting the first plurality of digital signals to a wavelength-division multiplexing (WDM) unit coupled to the encoding unit, wherein the WDM unit outputs a multiplexed signal comprising a plurality of wavelengths to a first cable connector;

wherein the video camera, the encoding unit, and the WDM unit form a combined module within a housing of the first device, and wherein the first cable connector is configured for connecting to a proximal end of a single fiber-optic cable;

wherein a distal end of the single fiber-optic cable is configured for connection to a second cable connector of the second device, and the multiplexed signal is transmitted on the single fiber-optic cable unidirectionally from the proximal end to the distal end;

wherein the second device comprises a second processing system including a second processor and a second memory that stores second executable instructions that, when executed by the second processing system, facilitate performance of operations comprising:

receiving the multiplexed signal at the second cable connector; and transmitting the multiplexed signal to a wavelength-division demultiplexing unit coupled to the second cable connector, wherein the wavelength-division demultiplexing unit provides four optical signals and performs optical-to-electrical conversion of the optical signals to generate a second plurality of digital signals representing the image data for presentation at a display of the second device.

18. The system of claim 17, wherein the transmitting of the first plurality of digital signals comprises transmitting the first plurality of digital signals as a plurality of serial digital interface (SDI) streams.

19. The system of claim 18, wherein the WDM unit performs electrical-to-optical conversion of the plurality of SDI streams to output the multiplexed signal.

20. The system of claim 17, wherein the housing has a port formed therein, and wherein the first cable connector is configured for connecting to the proximal end of the single fiber-optic cable via the port.

* * * * *